United States Patent [19]

Akram

[11] Patent Number: 4,503,398
[45] Date of Patent: Mar. 5, 1985

[54] AUTOMATIC GAIN CONTROL CIRCUIT
[75] Inventor: M. Faheem Akram, Mesa, Ariz.
[73] Assignee: Motorola, Inc., Schaumburg, Ill.
[21] Appl. No.: 453,330
[22] Filed: Dec. 27, 1982
[51] Int. Cl.³ .......................... H03G 3/10; H03K 23/22
[52] U.S. Cl. .................................. 330/285; 307/299 A
[58] Field of Search ............................... 330/278, 285; 307/299 A, 300, 540, 547, 549

[56] References Cited

U.S. PATENT DOCUMENTS 4,049,975  9/1977  Colaco ........................... 307/299 A
4,409,495  10/1983  Enomoto et al. ............... 307/299 A

*Primary Examiner*—James B. Mullins
*Assistant Examiner*—G. Wan

*Attorney, Agent, or Firm*—William E. Koch

[57] ABSTRACT

An automatic gain control circuit is provided for limiting the positive and negative peaks of an input waveform. A differential pair of PNP transistors are coupled to the collector of an NPN amplifying transistor for activating a limiting means on negative peaks of the input waveform as the amplifying transistor approaches cutoff. On positive peaks, a second emitter of the amplifying transistor acts as a collector drawing electrons injected into the base from the collector. A reverse current through the emitter activates the limiting means. The limiting means is coupled to the input terminal for limiting the positive and negative peaks beyond a predetermined level.

4 Claims, 1 Drawing Figure

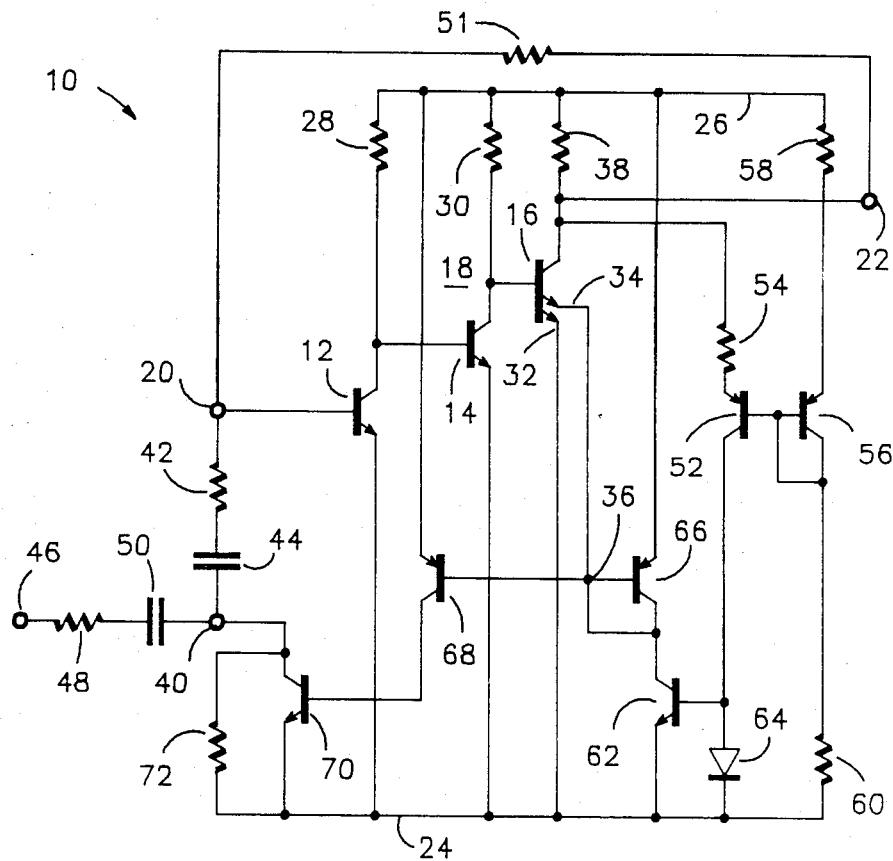

AUTOMATIC GAIN CONTROL CIRCUIT

BACKGROUND OF THE INVENTION

1. Field of the Invention

This invention relates, in general, to automatic gain control circuits and more particularly to a circuit that detects the onset of, and prevents saturation and cut off of an amplifying transistor of a speech network.

2. Background Art

An Electronic Telephone Chip (ETC) typically comprises a dual tone multifrequency dialer, a speech network, a microprocessor, and a voltage regulator. The low voltage, i.e., 1.1 volts, at which the ETC operates, presents inherent problems in these circuits. Furthermore, the problem is magnified as the number of telephones on a line increases. If the transistor amplifier in the speech network saturates on positive peaks of the voice signal or cuts off on negative peaks, a harsh sound or crackle is typically emitted from the phone.

To remedy this problem, typically, a multitransistor circuit is provided for draining excess signal current from the amplifying transistor. A pair of differentially connected PNP transistors will draw excess current from the collector of the NPN amplifying transistor and activate switching transistors that draw current from the base of the NPN amplifying transistor, thereby limiting the positive peak of the incoming signal.

A similar arrangement comprising a pair of differentially connected NPN transistors and a number of switching transistors would limit the negative peaks. Such a configuration consumes excessive chip area and increases cost.

Therefore, what is needed is an automatic gain control circuit having reduced chip area consumption that detects the onset of saturation and cut-off and limits the positive and negative peaks of an incoming signal by preventing an NPN transistor amplifier from going into cut-off or saturation.

SUMMARY OF THE INVENTION

Accordingly, it is an object of the present invention to provide an improved automatic gain control circuit.

Another object of the present invention is to provide an automatic gain control circuit that has a reduced chip area consumption.

In carrying out the above and other objects of the invention in one form, there is provided an improved automatic gain control circuit having a differential pair of PNP transistors coupled to the collector of an NPN amplifying transistor for activating a limiting means on positive peaks of an output signal as the amplifying transistor approaches cut-off. On negative peaks, a second emitter of the amplifying transistor acts as a collector drawing electrons injected into the base from the collector. The reverse current through the emitter activates the limiting means. The limiting means is coupled to the input terminal for limiting the positive and negative peaks beyond a predetermined level.

The above and other objects, features, and advantages of the present invention will be better understood from the following detailed description taken in conjunction with the accompanying drawing.

BRIEF DESCRIPTION OF THE DRAWING

The single FIGURE is a schematic of the automatic gain control circuit of the present invention.

DETAILED DESCRIPTION OF THE INVENTION

Referring to the single FIGURE, an automatic gain control circuit 10 is shown that is suitable to be fabricated in integrated circuit form as well as with discrete components. Transistors 12, 14, 16 form a three stage amplifier network 18 which is coupled between input coupling terminal 20 and output terminal 22. The base and emitter of transistor 12 are connected to terminal 20 and voltage conductor 24, respectively. The collector of transistor 12 is connected to the base of transistor 14 and is coupled to voltage conductor 26 by resistor 28. Voltage conductor 26 has a voltage value greater than that of voltage conductor 24. Voltage conductor 24 may, for example, be grounded. The emitter of transistor 14 is connected to voltage conductor 24 and its collector is connected to the base of transistor 16 and is coupled to voltage conductor 26 by resistor 30. A compensation capacitor, not shown, may be coupled between the collector and base of transistor 14. Emitters 32, 34 of transistor 16 are connected to voltage conductor 24 and node 36, respectively. A current limiting resistor, not shown, may be coupled between emitter 34 and node 36. The collector of transistor 16 is connected to output terminal 22 and is coupled to voltage conductor 26 by resistor 38. Transistors 12, 14, 16, function as a typical three stage amplifier for amplifying the signal applied to coupled terminal 20.

Coupling terminal 20 is coupled to coupling terminal 40 by resistor 42 and capacitor 44 connected in series. Terminal 40 is coupled to input terminal 46 by resistor 48 and capacitor 50 connected in series. Resistors 42, 48 and capacitors 44, 50 are external DC blocking and AC coupling devices. Resistor 51 is coupled between coupling terminal 20 and output terminal 22 for biasing transistors 12, 14, 16 and for providing a feedback path.

The collector of transistor 16 is further coupled to emitter of PNP transistor 52 by resistor 54. PNP transistors 52, 56 comprise a differential pair, wherein the emitter of transistor 56 is coupled to voltage conductor 26 by resistor 58. The collector of transistor 56 is connected to both the bases of transistors 52, 56 and is coupled to voltage conductor 24 by resistor 60. The collector of transistor 52 is connected to the base of transistor 62 and the anode of diode 64. The differential pair of PNP transistors 52, 56 are biased so that transistor 52 turns on when the collector of transistor 16 reaches a voltage indicative of transistor 16 going into cut-off.

The cathode of diode 64 and the emitter of transistor 62 are both connected to voltage conductor 24. The collector of transistor 62 is connected to both the collector of transistor 66 and node 36. The emitter and base of transistor 66 are connected to voltage conductor 26 and node 36, respectively. Transistor 68 has its emitter connected to voltage conductor 26 and its base connected to node 36. The collector of transistor 68 is connected to the base of transistor 70 so that transistors 68, 70 are responsive to the voltage at node 36. The collector and emitter of transistor 70 are connected to terminal 40 and voltage conductor 24, respectively. Biasing resistor 72 is coupled between terminal 40 and voltage conductor 24.

In operation, an input signal, representing a speech pattern for example, is applied to input terminal 46, and across resistor 48 and coupling capacitor 50 to terminal 40 and across resistor 42 and coupling capacitor 44 to terminal 20. The signal at terminal 20 is amplified by amplifier 18 with an output appearing at output terminal 22. When an excessively large input signal is applied, i.e., a loud voice, the high peak would tend to saturate transistor 16 or a low peak would tend to cut-off transistor 16.

However, the low peak of an input signal is limited by the differential pair transistors 52, 56 drawing current through resistor 38. The level at which this current is drawn is determined by transistor 56 and resistors 54, 58, 60. When transistor 52 is biased on, transistors 62, 66, 68, 70 are biased on, drawing current from terminal 40, thereby limiting the input signal. The positive voltage on node 36 reverse biases emitter 34 of transistor 16, effectively taking emitter 34 out of the circuit.

A high peak of the input signal at terminal 20 is limited by taking advantage of inverted transistor action of emitter 34 of transistor 16. When the collector of transistor 16 begins to go into saturation, electrons are injected into the base and are collected by positively biased emitted 34. Current is thereby drawn through the bases of transistors 66, 68. Transistor 70 is thus turned on, pulling current from terminal 40 and limiting the input signal.

By now it should be appreciated that there has been provided an improved automatic gain control circuit capable of operating at a very low voltage. The detector can limit the positive and negative peaks of an incoming signal with fewer components and a reduced chip area consumption.

I claim:

1. An automatic gain control circuit for limiting the peaks of an input signal comprising:

a transistor for amplifying said input signal having a base coupled for receiving said input signal, a collector coupled to an output terminal, and a first emitter coupled to a supply voltage terminal;

first means coupled to a second emitter of said transistor for limiting positive peaks of said input signal, said second emitter being positively biased to collect electrons from the base which are injected from the collector when it approaches saturation; and second means coupled to said collector of said transistor and said first means for limiting negative peaks of said input signal.

2. A circuit for limiting the positive and negative peaks of an audio waveform having an input terminal for receiving said waveform, and an output terminal, comprising:

amplifying means comprising at least one NPN transistor having a first emitter coupled to a supply voltage terminal, a base coupled to said input terminal, and a collector coupled to said output terminal for providing an output signal;

detection means coupled to said collector for detecting a predetermined voltage on said collector; and limiting means coupled to said input terminal, a second emitter of said NPN transistor, and said detection means, for limiting said input waveform, said limiting means responsive to said detection means on negative peaks of said waveform, said second emitter being positively biased so as to collect electrons from said base which were injected therein from said collector on positive peaks of said waveform.

3. The circuit according to claim 2 wherein said detection means comprises:

a first PNP transistor having an emitter coupled to said collector of said NPN transistor, and a collector coupled to said limiting means; and a second PNP transistor having a base and a collector both coupled to said base of said first PNP transistor.

4. The circuit according to claim 2 wherein said limiting means comprises:

a third PNP transistor having a base and a collector coupled to said detection means; and a fourth PNP transistor having a base coupled to both said second emitter of said NPN transistor and said base of said third PNP transistor, said collector coupled to said input terminal.

* * * * *